US010895896B1

(12) United States Patent
MacGregor et al.

(10) Patent No.: US 10,895,896 B1
(45) Date of Patent: Jan. 19, 2021

(54) POWER SYSTEM FOR SERVER RACK

(71) Applicant: Amazon Technologies, Inc., Seattle, WA (US)

(72) Inventors: Mike MacGregor, Seattle, WA (US); Darin Lee Frink, Lake Tapps, WA (US); Richard Arvel Stevens, Auburn, WA (US); William Mische, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 875 days.

(21) Appl. No.: 15/628,010

(22) Filed: Jun. 20, 2017

(51) Int. Cl.
*H02J 7/00* (2006.01)
*G06F 1/18* (2006.01)
*H05K 7/14* (2006.01)
*G06F 1/3287* (2019.01)
*G06F 1/26* (2006.01)
*G06F 1/3203* (2019.01)

(52) U.S. Cl.
CPC .............. *G06F 1/189* (2013.01); *G06F 1/263* (2013.01); *G06F 1/3203* (2013.01); *G06F 1/3287* (2013.01); *H05K 7/1492* (2013.01)

(58) Field of Classification Search
CPC ........ G06F 1/189; G06F 1/263; G06F 1/3203; G06F 1/3287; H05K 7/1492
See application file for complete search history.

(56) References Cited

U.S. PATENT DOCUMENTS

| 9,069,537 B2 | 6/2015 | Nakao | |
|---|---|---|---|
| 9,997,955 B1* | 6/2018 | Ross | H02J 1/001 |
| 2005/0162836 A1* | 7/2005 | Briggs | H05K 5/0021 361/724 |
| 2007/0170889 A1* | 7/2007 | Ishikawa | B60L 58/20 320/116 |
| 2008/0229133 A1* | 9/2008 | Yamanaka | G06F 1/3287 713/324 |
| 2014/0103721 A1* | 4/2014 | Lai | G06F 1/266 307/39 |
| 2014/0160686 A1* | 6/2014 | Benson | H02M 7/003 361/724 |
| 2014/0247540 A1* | 9/2014 | Steeves | H05K 7/1432 361/624 |
| 2014/0346869 A1* | 11/2014 | Kasai | B66C 13/00 307/22 |

(Continued)

OTHER PUBLICATIONS

U.S. Appl. No. 15/628,392, filed Jun. 20, 2017, Titled: Automatic Transfer Switch and Power Supply Module.

*Primary Examiner* — Arun C Williams

(74) *Attorney, Agent, or Firm* — Kilpatrick Townsend & Stockton LLP

(57) ABSTRACT

Power systems and methods for supplying direct current power to a server rack employ multiple power supply units. A method for supplying direct current power to a server rack includes receiving an alternating current (AC) power input. A first portion of the AC power input is transferred to a first automatic transfer switch (ATS). A first DC power input is generated from the first portion of the AC power input via a first power supply unit (PSU) and transferred to the server rack. A second portion of the AC power input is transferred to a second ATS. A second DC power input is generated from the second portion of the AC power input via a second PSU and transferred to the server rack.

20 Claims, 14 Drawing Sheets

(56) References Cited

U.S. PATENT DOCUMENTS

2015/0333544 A1* 11/2015 Toya .................. H02J 3/32
                                                                          320/112
2018/0368223 A1   12/2018  Johnson et al.

* cited by examiner

| Value | State | Description |
|---|---|---|
| 00h | Priority Level 1 | ATSPSUs are allowed to transfer to S2 as soon as possible and begin charging their batteries |
| 01h | Priority Level 2 | ATSPSUs are allowed to transfer to S2 as soon as possible but may not charge their batteries. |
| 02h | Priority Level 3 | ATSPSUs are allowed to transfer to S2 only after receiving command P3_allowed |
| 03h | Priority Level 4 | ATSPSU are allowed to transfer to S2 only after receiving command P4_allowed |
| 04h | Priority Level 5 | ATSPSU are allowed to transfer to S2 only after receiving command P5_allowed |

FIG. 12

| SOC [%] | TIME REMAINING [s] | TIME FOR PROVING STABILITY OF AC POWER SOURCE [s] |
|---|---|---|
| 100 | 180 | 10 |
| 90 | 162 | 9 |
| 80 | 144 | 8 |
| 70 | 126 | 7 |
| 60 | 108 | 6 |
| 50 | 90 | 5 |
| 40 | 72 | 4 |
| 30 | 54 | 3 |
| 20 | 36 | 2 |
| 10 | 18 | 1 |
| 0 | 0 | 0 |

| SOC [%] | TIME REMAINING [s] | TIME TO WAIT BEFORE CHARGING [s] | |
|---:|---:|---:|---|
| 100 | 180 | 100 | |
| 90 | 162 | 90 | |
| 80 | 144 | 80 | |
| 70 | 126 | 70 | |
| 60 | 108 | 60 | |
| 50 | 90 | 50 | |
| 40 | 72 | 40 | |
| 30 | 54 | 30 | |
| 20 | 36 | 20 | |
| 10 | 18 | 10 | |
| 0 | 0 | 5 | |

POWER SYSTEM FOR SERVER RACK

BACKGROUND

A datacenter typically contains a collection of computer servers and components for the management, operation and connectivity of those servers, including power management systems that provide continued power for operation of datacenter components in the event of interruption of power provided by a primary power source. Existing power management systems for datacenters, however, typically employ secondary power sources that are relatively large and expensive.

BRIEF DESCRIPTION OF THE DRAWINGS

Various embodiments in accordance with the present disclosure will be described with reference to the drawings, in which:

FIG. 12 shows a table of programmable configurations of embodiments of the ATSPSU of the power system of FIG. 1;

DETAILED DESCRIPTION

Figure 1:
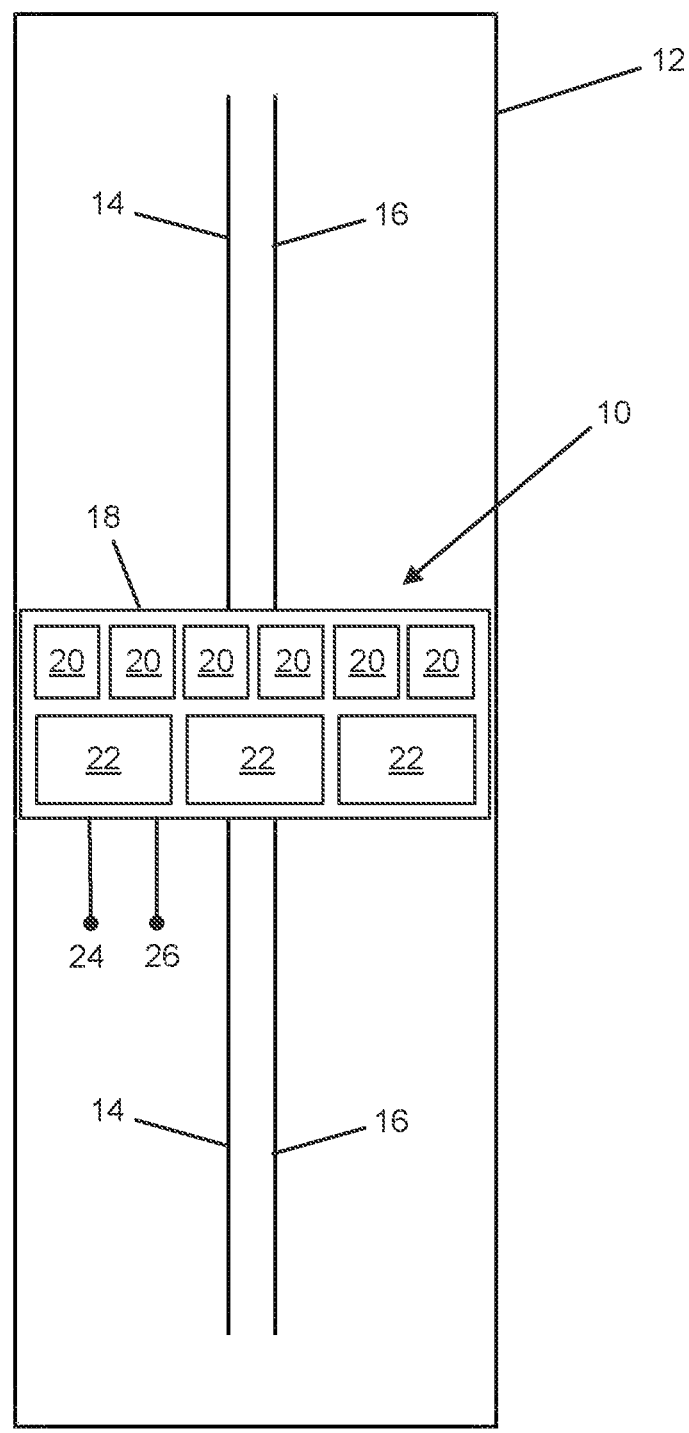
FIG. 1 is a front view of a redundant uninterruptable power system mounted in a server rack for supplying direct current (DC) power to server rack components via DC bus bars of the server rack, in accordance with some embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

In many embodiments, a power system for supplying direct current (DC) to a server rack includes a backplane assembly that is mountable in the server rack, one or more detachably mountable automatic transfer switch and power supply units (ATSPSU), and one or more detachably mountable battery modules (BM). Each of the one or more ATSPSUs is configured to generate direct current (DC) power from alternating current (AC) input power and output the DC power to DC bus bars of the server rack. Each of the one or more BMs is configured to provide backup DC power to the DC bus bars in the event of discontinuity in the supply of DC power to the DC bus bars by the ATSPSUs.

Each of the one or more ATSPSUs and each of the one or more BMs can employ an autonomous control process that can be used in the absence of communication with other elements of the power system. For example, each of the ATSPSUs can be configured to monitor voltage of a primary AC power source and react to significant discontinuities in the voltage of the primary AC power source by discontinuing output of DC power to the DC bus bars. The one or more BMs can monitor the voltage between the DC bus bars and, in response to a drop in the voltage between the DC bus bars indicative of insufficient supply of DC power to the DC bus bars by the one or more ATSPSUs, supply DC power to the DC bus bars for a period of time. Any suitable number of the one or more ATSPSUs can be configured to switch over to generating DC power from AC power supplied by a secondary AC power source to supply DC power to the DC bus bars, for example, either in response to a drop in voltage between the DC bus bars indicative of insufficient supply of DC power to the DC bus bars by the one or more BMs, or after a suitable time delay following failure of the primary AC power source. The one or more BMs can be configured to, in response to detecting a sufficient voltage level between the DC bus bars, charge at a conservative rate, which can be set (e.g., via firmware/software) so that upstream circuit breakers are not tripped under maximum loads.

Control of the power system can be augmented via communication between the one or more ATSPSUs and the one or more BMs. For example, a state of charge of the one or more BMs can be communicated to the one or more ATSPSUs and, in response to the state of charge being sufficient to power the server rack components for a suitable time period, the one or more ATSPSUs can allow the BMs to discharge without transferring to generating DC power via power supplied by the secondary AC power source. The BMs can communicate each of their states of charge with the other of the BMs and decide to charge or discharge separately or in unison. The one or more ATSPSUs can communicate the current power usage of the server rack components to the BMs, which can use the current power usage to control recharging to maximize the recharging of the BMs without exceeding total maximum allowable power usage.

Control of the power system can be augmented via communication between a controller included in the back plane assembly (BPA), the one or more ATSPSUs, and the one or more BMs, or between a central management module and one or more of the power systems via a data center communication network. For example, if either of the primary AC power source or the secondary AC power source is near its capacity limit, then the one or more power systems can be centrally controlled to operate using designated sources of the primary and secondary AC power sources, supply battery power to the DC bus bars, or limit the rate at which the BMs are allowed to recharge.

Turning now to the figures, FIG. 1 shows a front view of a redundant uninterruptable power system 10 mounted in a server rack 12, in accordance with some embodiments. The power system 10 is configured to redundantly supply direct current (DC) power to components mounted in server rack 12 via DC bus bars 14, 16 of the server rack 12. The power system 10 includes a backplane assembly (BPA) 18, automatic transfer switch and power supply units (ATSPSUs) 20, and battery modules (BMs) 22. In the illustrated embodiment, each of the ATSPSUs 20 and each of the BMs 22 is detachably mountable to the BPA 18 via insertion through a front face of the server rack 12. A primary AC power source input 24 and a secondary AC power source input 26 are operatively coupled with the BPA 18, which operatively couples each of the primary AC power source input 24 and the secondary AC power source input 26 with each of the ATSPSUs 20 when mounted to the BPA 18.

The ATSPSUs 20 and the BMs 22 are configured to redundantly supply power to the DC bus bars 14, 16 for consumption by components mounted in the server rack 12. Each of the ATSPSUs 20 is configured to generate DC power from AC power received from either the primary AC power source input 24 or the secondary AC power source input 26 via the BPA 18, and output the generated DC power to the DC bus bars 14, 16. Each of the BMs 22 provides a backup source of DC power that is supplied to the DC bus bars 14, 16 in the event of insufficient DC power being supplied to the DC bus bars 14, 16 by the ATSPSUs 20.

Figure 2:
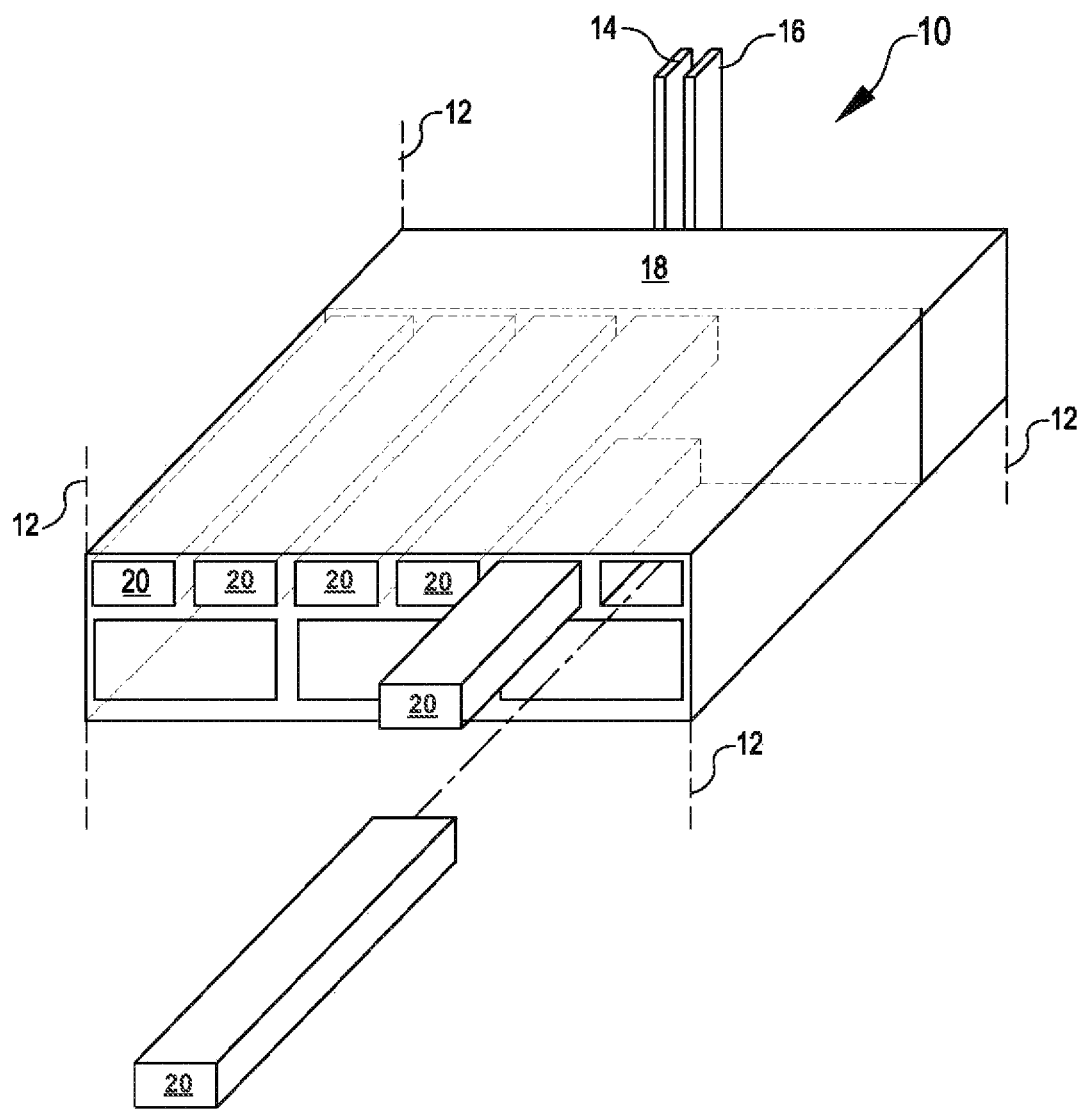
FIG. 2 is a three-dimensional view illustrating a detachably mountable automatic transfer switch and power supply unit (ATSPSU) and a backplane assembly (BPA) of the power system of FIG. 1, in accordance with some embodiments.
Figure 3:
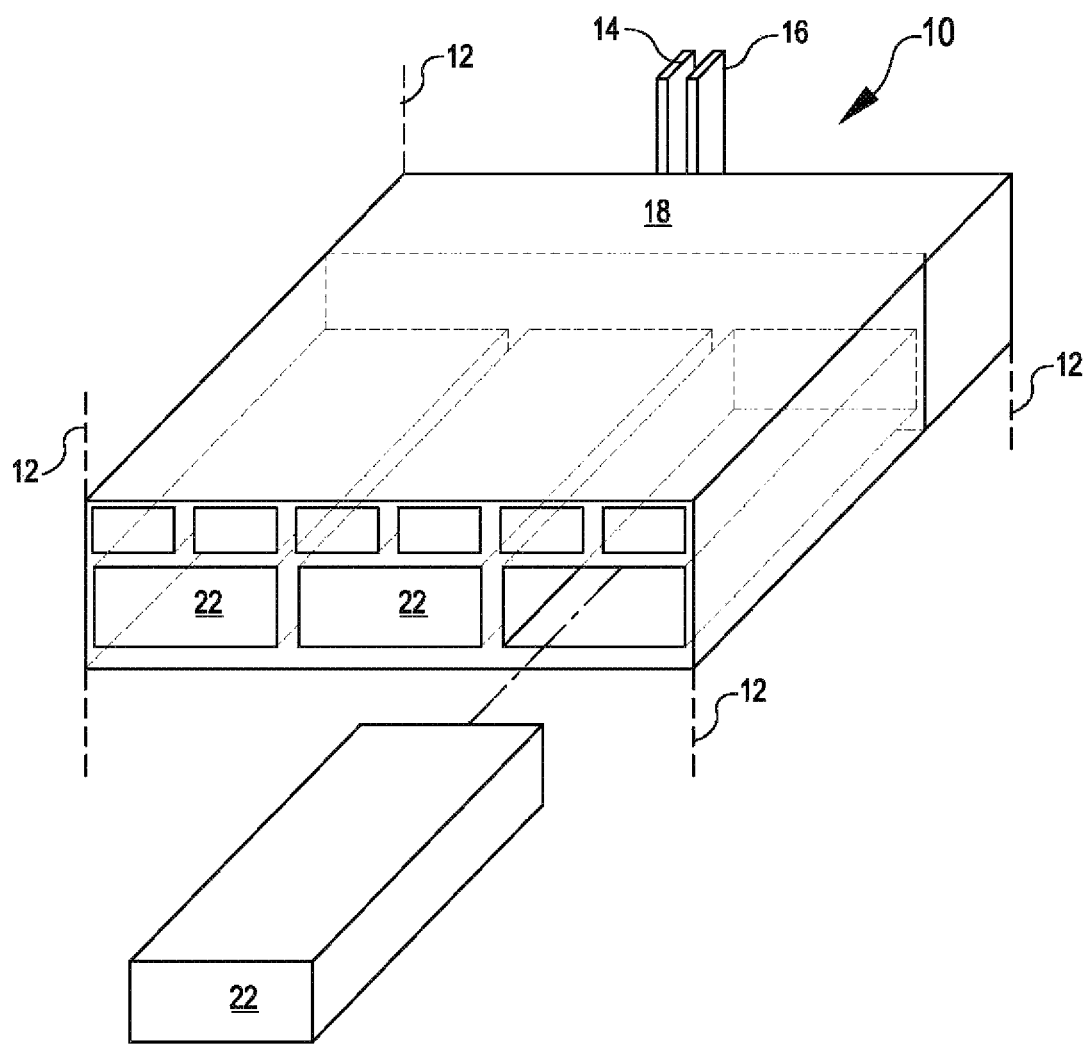
FIG. 3 is a three-dimensional view illustrating a detachably mountable battery module (BM) and a backplane assembly (BPA) of the power system of FIG. 1, in accordance with some embodiments.

FIGS. 2 and 3 show three-dimensional view further illustrating the power system 10. FIG. 2 shows a three-dimensional view illustrating ATSPSUs 20 mounted to the BPA 18 of the power system 10, which is mounted in the server rack 12. FIG. 3 shows a three-dimensional view illustrating BMs 22 mounted to the BPA 18 of the power system 10, which is mounted in the server rack 12. In the illustrated embodiment, six ATSPSUs 20 are arranged side-by-side in an upper row and three BMs 22 are arranged side-by-side in a lower row below the upper row. In many embodiments, each of the ATSPSUs 20 and each of the BMs 22 can be "hot" mounted to and demounted from the BPA 18 while power is supplied to DC bus bars 14, 16 via the other mounted ATSPSUs 20 and/or BMs 22. In the illustrated embodiment, having six ATSPSUs 20, at 3 KVA each, provide 18 KVA total, thereby exceeding a desired minimum of 15 KVA. Additionally, having six ATSPSUs 20 enable having two ATSPSUs 20 on each of three phases of an AC power source.

Figure 4:
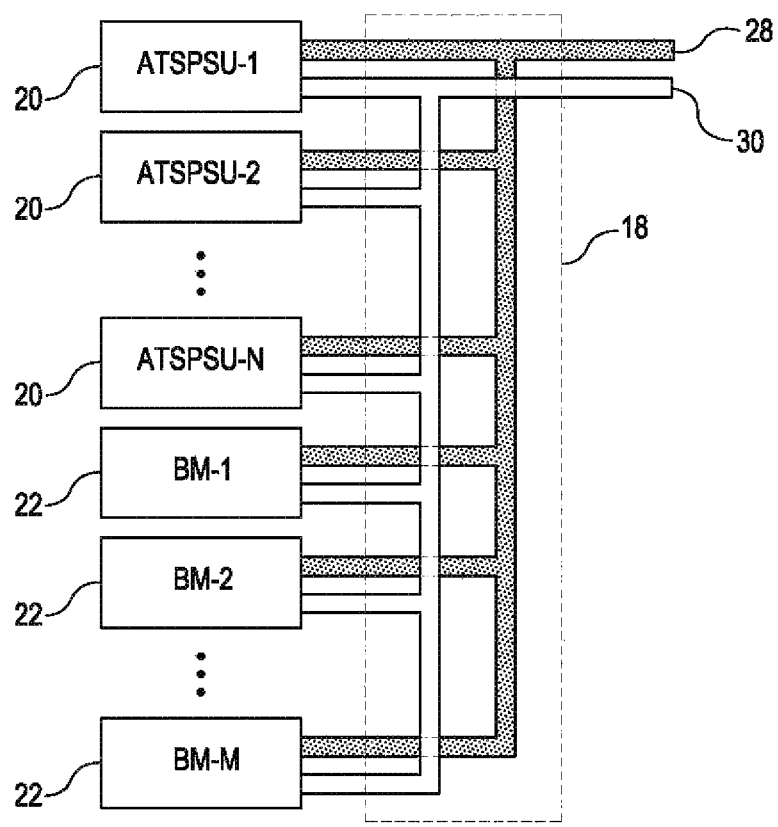
FIG. 4 is a simplified schematic diagram illustrating a plurality of ATSPSUs and a plurality of BMs electrically connected with DC bus bars of a server rack, in accordance with some embodiments.

FIG. 4 is a simplified schematic diagram illustrating DC power output current paths provided by the BPA 18 for output of DC power to the DC bus bars 14, 16 by the ATSPSUs 20 and the BMs 22, and input of DC power from the DC bus bars 14, 16 to the BMs 22 when recharging the BMs 22. In the illustrated embodiment, the BPA 18 transfers DC power to the DC bus bars 14, 16 via DC output leads 28, 30, which are each electrically connected to DC power outputs of each of the ATSPSUs 20 and DC output/inputs of each of the BMs 22.

Figure 5:
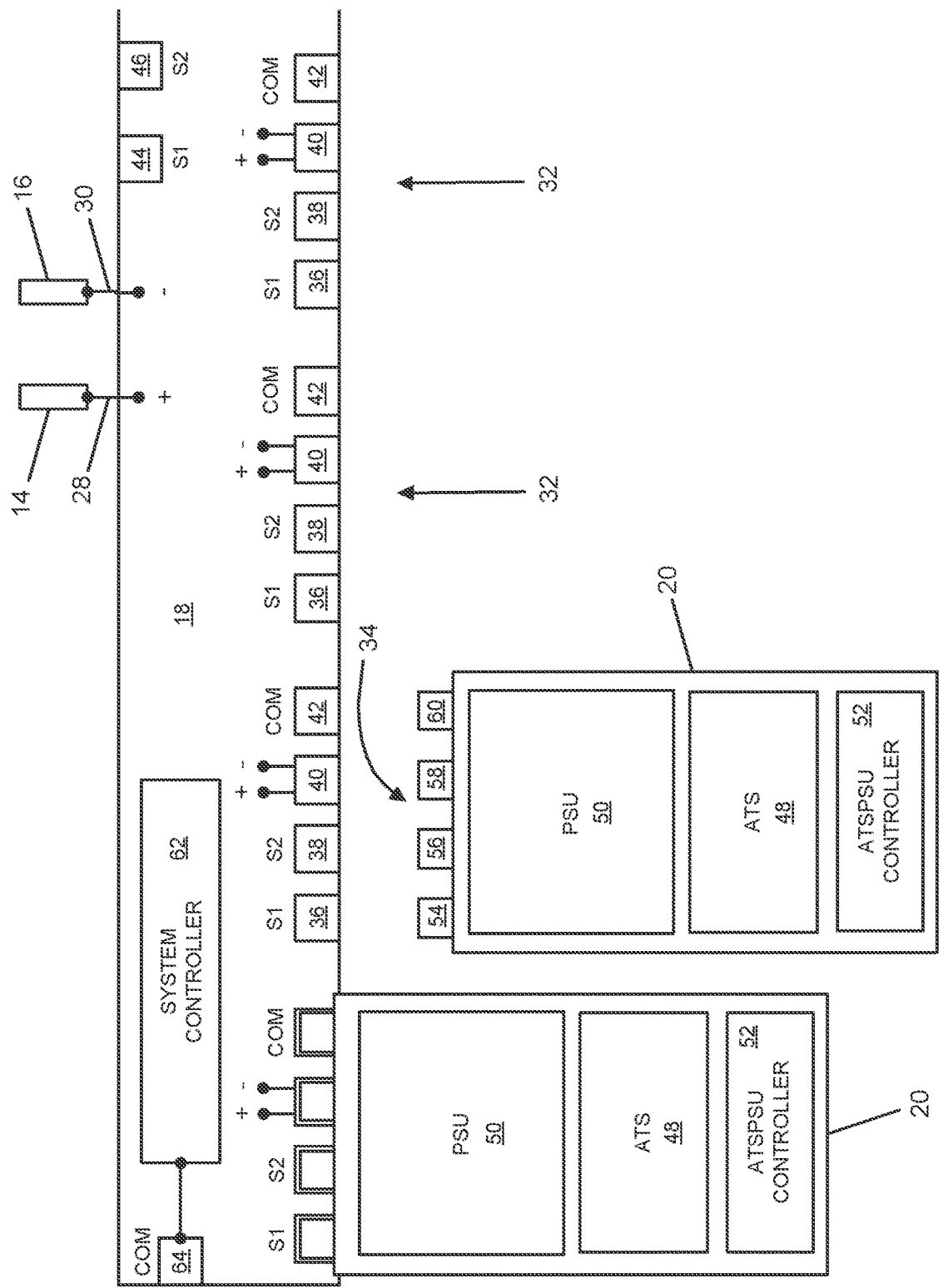
FIG. 5 is a simplified schematic diagram illustrating exemplary embodiments of the BPA and ATSPSUs of the power system of FIG. 1.

FIG. 5 is a simplified schematic diagram illustrating an embodiment of the BPA 18 and ATSPSUs 20 of the power system 10. The BPA 18 includes a BPA ATSPSU connector assembly 32 for each of the ATSPSUs 20. Each of the ATSPSUs 20 includes an ATSPSU connector assembly 34 configured to connect with a respective BPA ATSPSU connector assembly 32.

The BPA 18 is configured to electrically connect each of the ATSPSUs 20 with a primary AC power source, a secondary AC power source, and the DC bus bars 14, 16. Each of the BPA ATSPSU connector assemblies 32 include a primary AC power source connector 36, a secondary AC power source connector 38, a DC power input connector 40, and a communication connector 42. The BPA 18 includes a primary AC power source input connector 44, which is electrically connected to each of the primary AC power source connectors 36 and configured to receive AC power from a primary AC power source. The BPA 18 includes a secondary AC power source input connector 46, which is electrically connected to each of the secondary AC power source connectors 38 and configured to receive AC power from a secondary AC power source. The BPA 18 electrically couples the DC bus bars 14, 16 with each of the DC power input connectors 40 via DC output leads 28, 30. The BPA 18 can have any suitable configuration, such as any suitable combination of conductors and connectors supported in any suitable manner.

The BPA 18 is configured to communicatively couple the ATSPSUs 20 and the BMs 22. The communication connectors 42 are communicatively coupled via a communication bus included in the BPA 18 to enable communication between each of the ATSPSUs 20 and each of the BMs 22. Any suitable communication connector can be used for the communication connector 42. For example, an RJ45 connector can be used as the communication connector and Ethernet networking used for communication between the ATSPSUs 20 and the BMs 22.

Each of the ATSPSUs 20 includes an automatic transfer switch (ATS) 48, a power supply unit (PSU) 50, an ATSPSU controller 52, and the ATSPSU connector assembly 34. The ATSPSU connector assembly 34 includes a primary AC power source input connector 54, a secondary AC power source input connector 56, a DC power output connector 58, and a communication connector 60. Connector 54 is configured to connect with connector 36. Connector 56 is configured to connect with connector 38. Connector 58 is configured to connect with connector 40. Connector 60 is configured to connect with connector 42. The ATS 48 is electrically connected with each of connectors 54, 56 so as to be electrically connected with each of the primary and secondary AC power sources via the BPA 18. The ATS 48 is configured to selectively supply AC power to the PSU 50 from either the primary AC power source or the secondary AC power source as described herein. The PSU 50 generates DC power from the AC power received from the ATS 48 and outputs the generated power to the DC bus bars 14, 16 via the DC power output connector 58 and the BPA 18.

The ATSPSU controller 52 is operatively connected with the ATS 48 and the PSU 50 and controls operation of the ATS 48 and the PSU 50 as described herein. In many embodiments, the ATSPSU controller 52 is configured to (a) monitor a voltage of the primary AC power source (e.g., a line to neutral voltage of the primary AC power source); (b) monitor a voltage of the secondary AC power source (e.g., a line to neutral voltage of the secondary AC power source); (c) monitor voltage between the DC bus bars; (d) control the PSU 50 to terminate output of DC power from the PSU 50 to the DC power output connector 58 in response to detecting a qualifying voltage drop instance in the primary AC power source as described herein when the ATS 48 is supplying AC power to the PSU 50 from the primary AC power source or a qualifying voltage drop instance in the secondary AC power source as described herein when the ATS 48 is supplying AC power to the PSU 50 from the secondary AC power source; and (e) control the ATS 48 to switch between supplying AC power to the PSU 50 between the primary AC power source and the secondary AC power source in response to the monitored voltages of the primary and secondary AC power sources and the monitored voltage between the DC bus bars as described herein.

The BPA 18 can optionally include a BPA controller 62 and/or an external communication port 64. The BPA controller 62 can be configured to monitor total electrical power consumed by the components of the server rack 12 and coordinate operation of the ATSPSUs 20 and the BMs 22 in accordance with the total electrical power consumed and constraints on the amount of AC power that can be obtained from each of the primary and secondary AC power sources. The external communication port 64 can be used to network the ATSPSUs 20 and the BMs 22 and/or the BPA controller 62 with an external power management module via a data center network so that the operation of the power system 10 can be controlled in conjunction with simultaneous control of one or more other power systems 10 supplying power to other server racks 12 powered by the primary and secondary AC power sources so as to better control total loads placed on one or both of the primary and secondary AC power sources.

Figure 6:
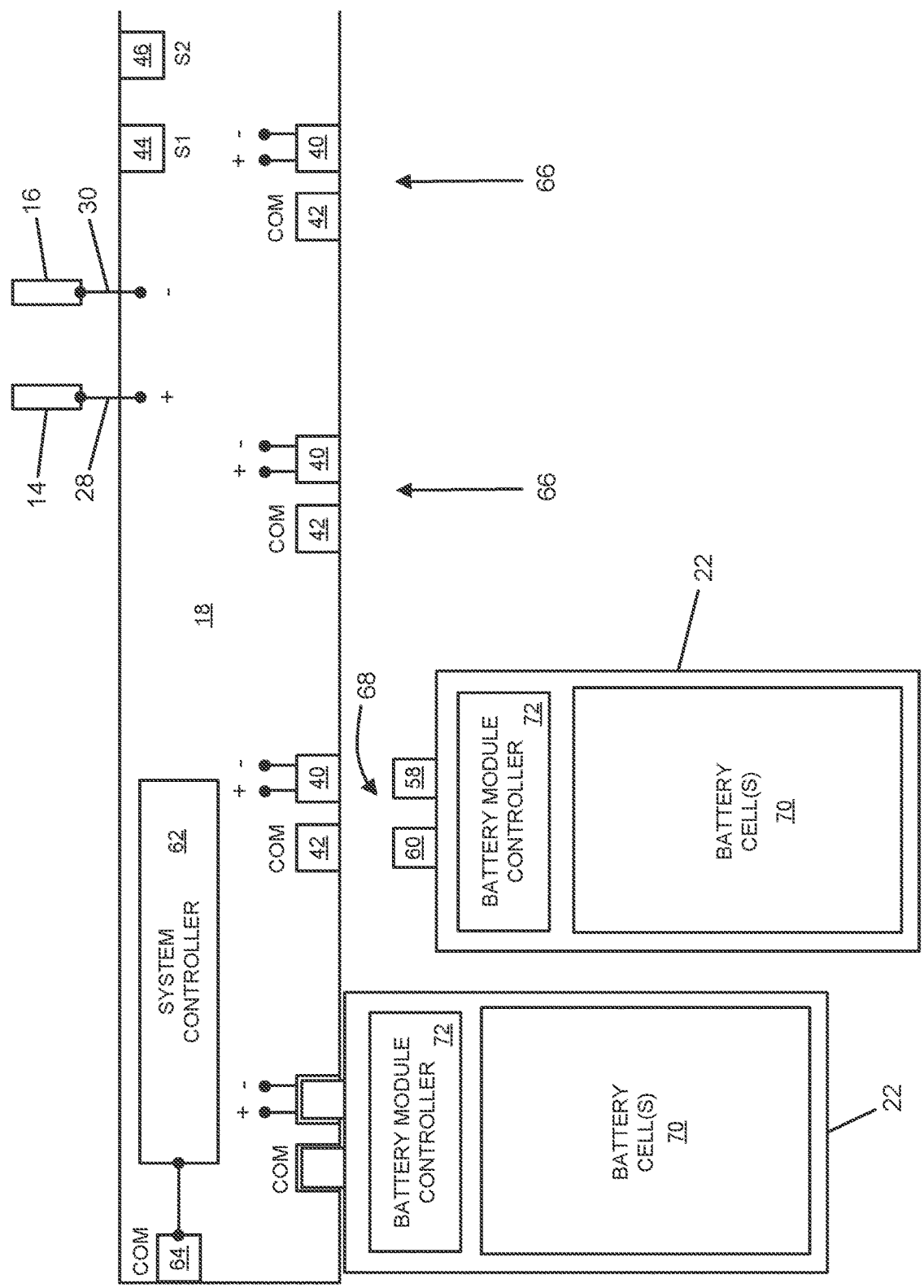
FIG. 6 is a simplified schematic diagram illustrating exemplary embodiments of the BPA and battery modules of the power system of FIG. 1.

FIG. 6 is a simplified schematic diagram illustrating an embodiment of the BPA 18 and BMs 22 of the power system 10. The BPA 18 includes a BPA BM connector assembly 66 for each of the BMs 22. Each of the BMs 22 includes a BM connector assembly 68 configured to connect with a respective BPA BM connector assembly 66.

The BPA 18 is configured to electrically connect each of the BMs 22 with the DC bus bars 14, 16. Each of the BPA BM connector assemblies 66 includes a DC power connector 40, and a communication connector 42. The BPA 18 electrically couples the DC bus bars 14, 16 with each of the DC power connectors 40 via DC output leads 28, 30.

Each of the BMs 2s includes one or more battery cells 70 and a BM controller 72, and the BM connector assembly 68. The BM connector assembly 68 includes a DC power connector 58 and a communication connector 60. Connector 58 is configured to connect with connector 40. Connector 60 is configured to connect with connector 42.

The BM controller 72 controls operation of the BM 22. In many embodiments, the BM controller 72 is configured to (a) monitor voltage between the DC bus bars; and (b) control discharging and charging of the one or more battery cells 70 as described herein.

Figure 7:
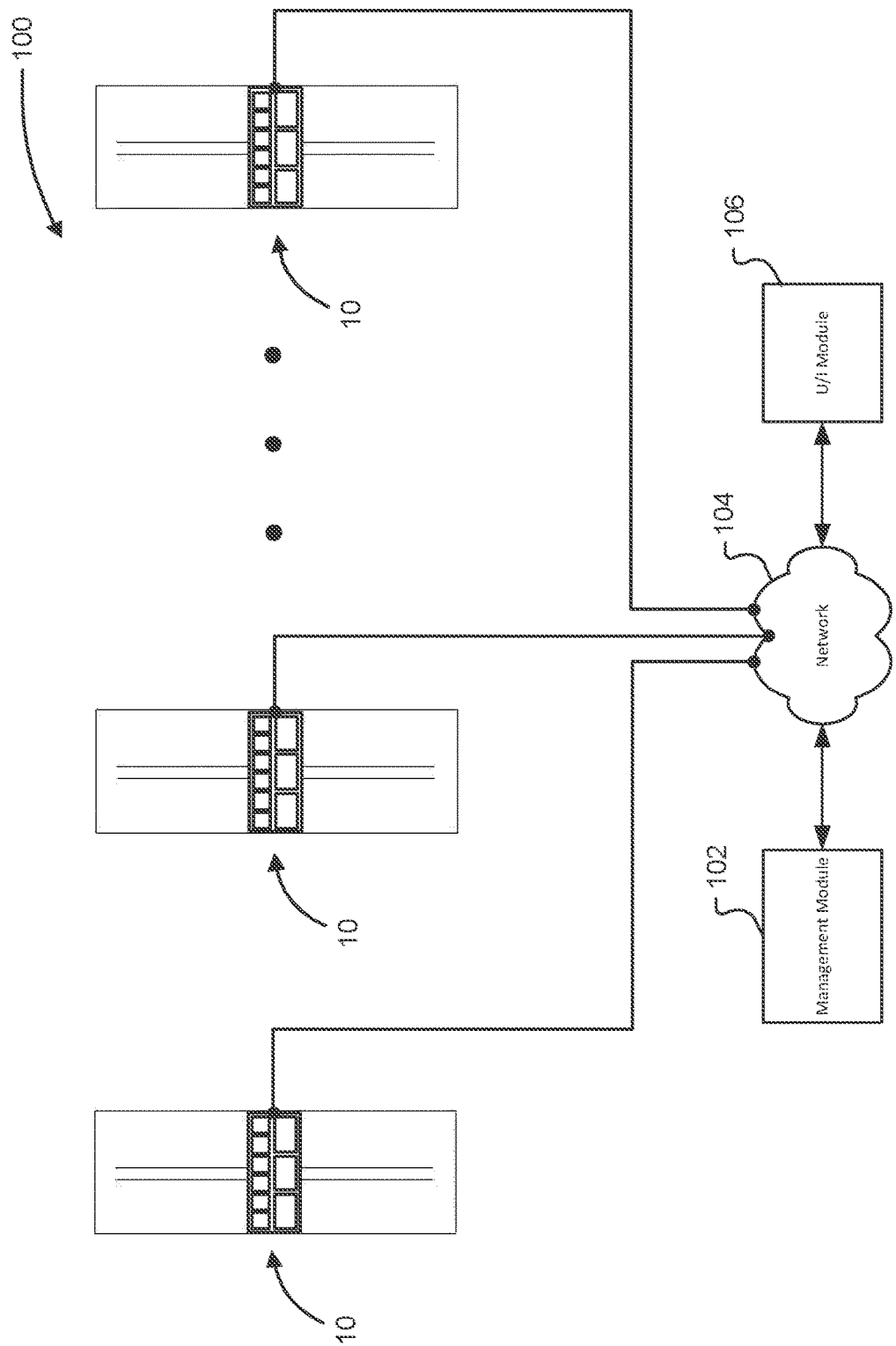
FIG. 7 is a simplified schematic diagram illustrating a datacenter power management system that includes multiple instances of the power system of FIG. 1, a management module, and a communication network, in accordance with some embodiments.

FIG. 7 is a simplified schematic diagram illustrating a datacenter power management system 100 that includes multiple instances of the power system 10, a management module 102, a communication network 104, and a user interface module 106 in accordance with some embodiments. In the power management system 100, the management module 102 is configured to control operation of the individual power systems 10 so as to avoid overloading the secondary AC power source in the event of a failure of the primary AC power source. For example, the management module 102 can control which of the ATSPSUs 20 in each of the power systems 10 switch to generating DC power via AC power supplied by the secondary AC power source, thereby controlling the total load placed on the secondary AC power source to avoid overloading the secondary AC power source. The management module 102 can also monitor total data center power consumption level and limit charging of the BMs in each of the power systems 10 to a suitable rate in view of the total data center power consumption level to avoid overloading either of the secondary AC power source and the primary AC power source. The user interface 106 is configured to display system operational parameters to a user and to accept input from a user for configuration and operation of the power management system 100.

In many embodiments, the power system 10 and the power management system 100 provide a variety of benefits relative to existing power supply systems. For example, the power system 10 and the power management system 100 employ reduced layers of redundancy relative to existing power supply systems as a result of each of the power systems 10 including multiple ATSPSUs 20 and one or more battery modules 22. The power system 10 is configured to continue to supply DC power for a period of time in the event of failure of one or both of the first and second AC power sources, thereby providing immunity to many potential failures of the first and second AC power sources. The power system 10 and the power management system 100 can be employed to reduce costs and production capacity constraints that limit growth in a datacenter by using standardized components (e.g., ATSPSUs 20, BMs 22) that can be obtained from multiple sources. In many embodiments, the power system 10 includes multiple ATSPSUs 20 (e.g., 2, 3, 4, 5, 6, or more) and multiple BMs 22 (e.g., 2, 3, or more), the power system 10 can continue to supply DC current even in the event of a failure of one of the ATSPSUs 20 or one of the BMs 22, thereby helping to reduce the number of customers affected when a failure does occur. The power system 10 and/or the power management system 100 can be configured to reflect a desired tradeoff between autonomous operation to avoid failure propagation and networked operation to enable the actions to be based on an overall operational state. In many embodiments, the power system 10 is configured to react to intermittent peaks in power demand via discharging the BMs 22, thereby isolating the primary AC power source from being impacted and allowing corresponding reduction in the size and cost of the primary AC power system relative to existing power supply systems. For example, each of the PSUs 50 can be limited to a maximum power output thereby forcing the BMs 22 to discharge in response to intermittent power demand exceeding the combined maximum output of the PSUs 50.

In many embodiments, the power system 10 and/or the power management system 100 are configured to control operation based on a variety of inputs. The variety of inputs can include any suitable combination of (a) whether the primary AC power source is in an operational state (e.g., providing AC power having a suitable voltage profile) or in a failed state (e.g., failing to provide AC power having a suitable voltage profile), (b) whether the secondary AC power source is in an operational state (e.g., providing AC power having a suitable voltage profile) or in a failed state (e.g., failing to provide AC power having a suitable voltage profile), (c) the voltage between the DC bus bars 14, 16, which can be used to detect failure of a PSU 50 or a BM 22, and can be used to balance the output of the PSUs 50 or the BMs 22 using droop control (e.g., as described herein) (d) amount of DC current supplied to the DC bus bars 14, 16, (e) amount of current being supplied by the DC bus bars 14, 16 to each load, (f) the state of charge of the BMs 22, (g) operational time remaining (e.g., seconds) via power supplied by the BMs 22 or a combination of the BMs 22 and the secondary AC power source, and (h) total amount of load being serviced by the secondary AC power source, which can be used to determine residual capacity available to service additional loads that are candidates for being serviced via the secondary AC power source, for example, as a result of prolonged failure of the primary AC power source.

In many embodiments, the power system 10 and/or the power management system 100 are configured to control operation based on a variety of priorities and constraints. For example, the power system 10 and/or the power management system 100 can be configured to prioritize servicing of a certain load(s) over another load(s) for any suitable reason, such as a customer(s) paying more for better reliability/availability/immunity to outages. For example, the power system 10 and/or the power management system 10 can be configured to decide not to switch over to supplying a load via power received from the secondary AC power source if the load at risk is low priority and the secondary AC power source is already close to being overloaded. The charging of the BMs 22 can be constrained to prevent exceeding the capacity of the primary AC power source in view of the combined power draw of loads being serviced by the primary AC power source. The charging of the BMs 22 can also be constrained to prevent exceeding the capacity of the secondary AC power source in view of the combined power draw of loads being serviced by the secondary AC power source. The number of PSUs 50 supplied power from the secondary AC power source can be constrained to prevent exceeding the capacity of the secondary AC power source in view of the combined power draw of loads being serviced by the secondary AC power source.

In many embodiments, the power system 10 and/or the power management system 100 can be configured to achieve various objectives. For example, the various objectives can include providing power to most (if not all) loads during a utility power outage. The objectives can include keeping the BMs 22 fully charged when possible (e.g., recharging the BMs 22 as fast as possible following discharge of the BMs 22) to be in a state of readiness for a potential failure of the primary AC power source. The objectives can include avoiding supplying power to the loads from the secondary AC power source as much as possible so that the secondary AC power source has residual capacity available to additional load(s). The objectives can include sharing loads by the PSUs 50 of the power system 10 so as to operate the PSUs 50 at an output level for which the PSUs 50 are most efficiently operated. For example, one or more PSUs 50 can be deactivated so as to boost the load handled by the remaining PSUs 50 to an output level in which the remaining PSUs 50 operate more efficiently.

Figure 8:
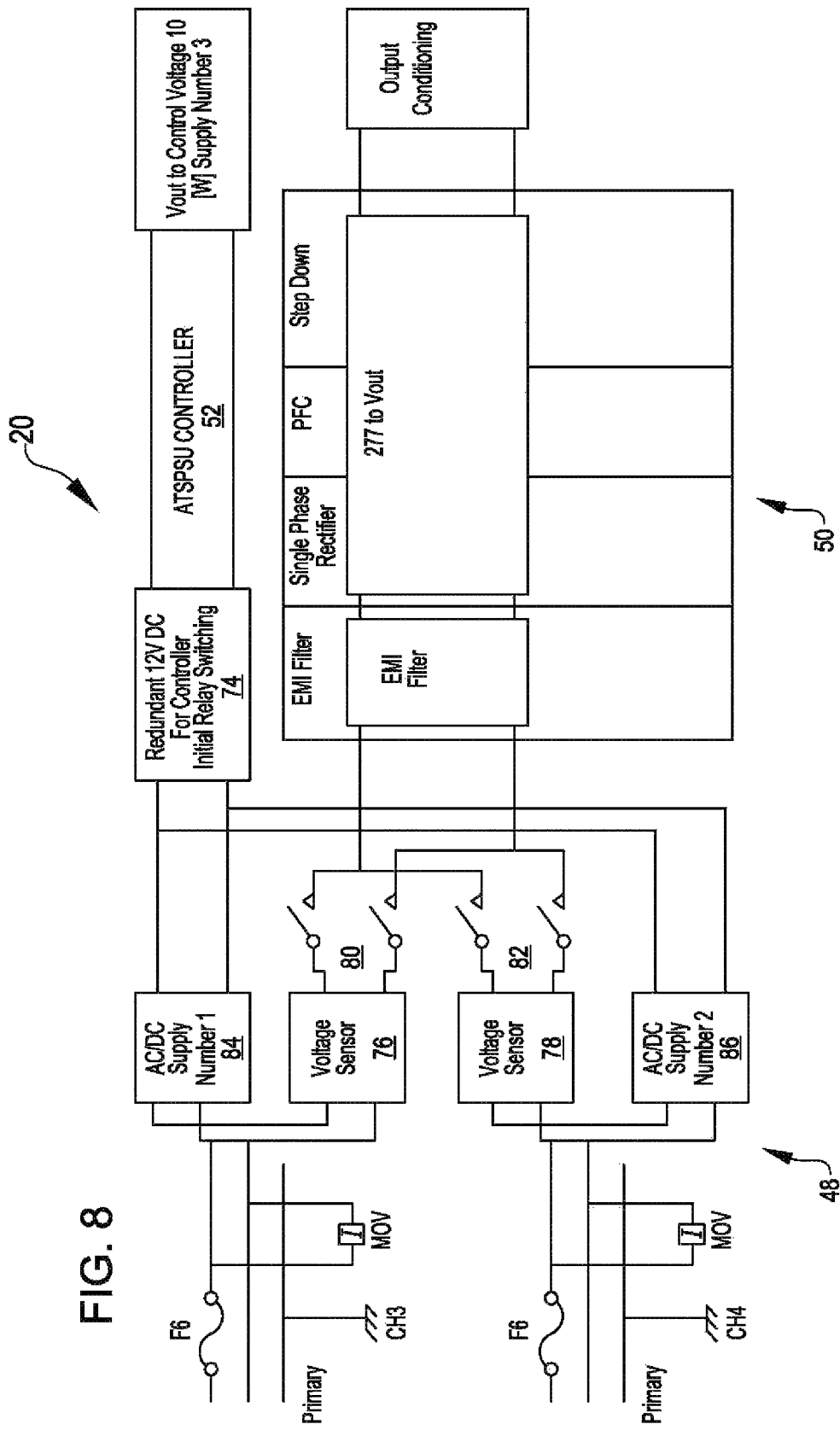
FIG. 8 is a simplified schematic diagram illustrating an embodiment of the ATSPSU unit of the power system of FIG. 1.

FIG. 8 is a simplified schematic diagram illustrating an embodiment of the ATSPSU 20 of the power system 10. In the illustrated embodiment, the ATSPSU 20 includes the ATS 48, the PSU 50, the ATSPSU controller 52, and a redundant 12V DC supply 74 for supplying 12V DC power to the ATSPSU controller 52 and for initial relay switching. The ATS 48 includes a primary AC source voltage sensor 76, a secondary AC source voltage sensor 78, primary AC source switches 80, secondary AC source switches 82, a first AC/DC supply 84, and a second AC/DC supply 86. The ATSPSU controller 52 monitors a voltage of the primary AC power source via the voltage sensor 76, a voltage of the secondary AC power source via the voltage sensor 78, and monitors a voltage between the DC bus bars 14, 16 via feedback of the DC output of the PSU 50 to the ATSPSU controller 52. The ATSPSU controller 52 controls operation of the primary AC source switches 80 to selectively connect and disconnect the PSU 50 from the primary AC power source, operation of the secondary AC source switches 82 to selectively connect and disconnect the PSU 50 from the secondary AC power source, and operation of the PSU 50 to selectively generate and output DC power to the DC bus bars 14, 16 or isolate the PSU 50 from the DC bus bars 14, 16 as described herein with respect to operational modes of the ATSPSUs 20.

Figure 9:
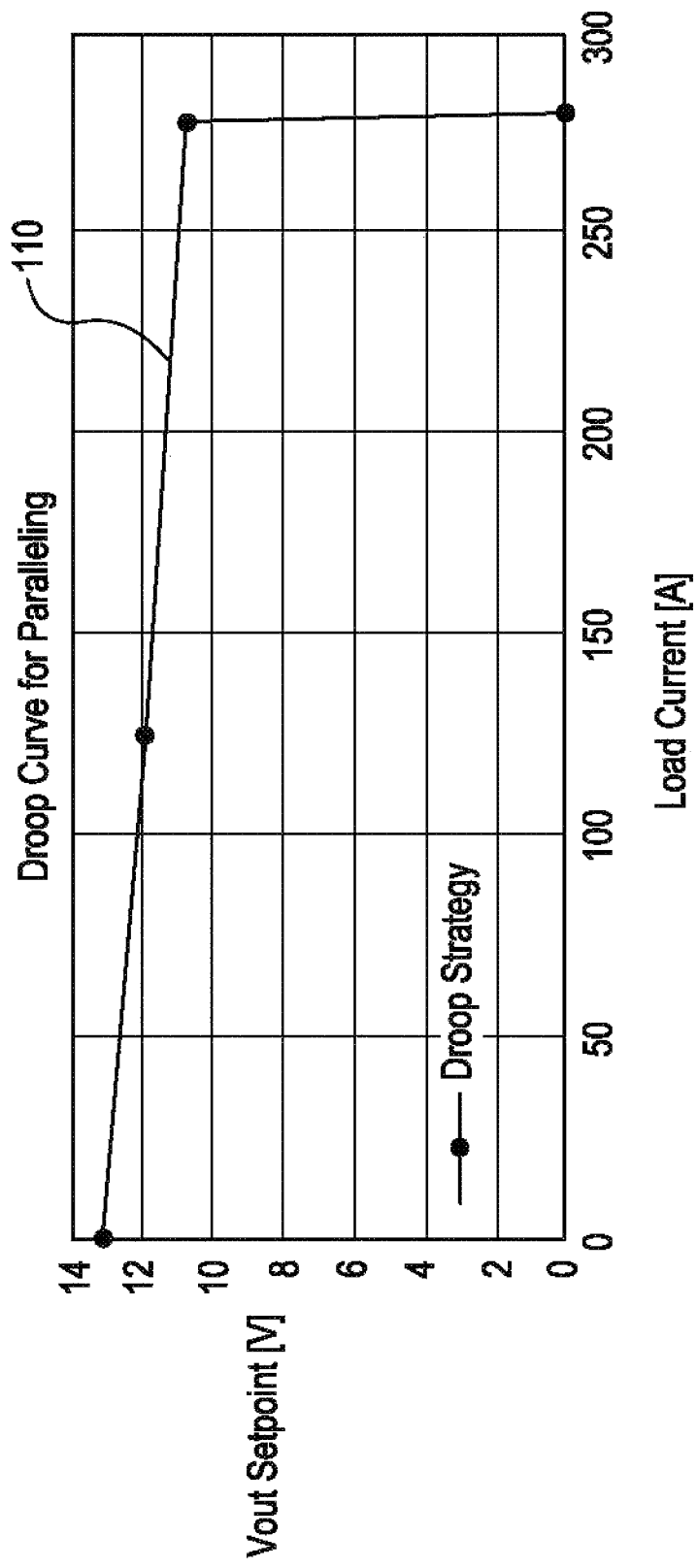
FIG. 9 shows a curve defining a target output voltage as a function of load current for use in balancing load share in embodiments of the power system of FIG. 1.

FIG. 9 shows a curve defining a target output voltage 110 as a function of load current for use in balancing load share in embodiments of the power system 10. By monitoring the voltage between the DC bus bars 14, 16 and their own current output, each of the ATSPSUs 20 can adjust the amount of current it outputs in accordance with the target output voltage curve 110, which will result in each of the ATSPSUs 20 outputting substantially the same current. Likewise, when operating under battery power, by monitoring the voltage between the DC bus bars 14, 16 and their own current output, each of the BMs 22 can adjust the amount of current it outputs in accordance with the target output voltage curve 110, which will result in each of the BMs 22 outputting substantially the same current. When transitioning from supplying power from the BMs 22 to supplying power from the ATSPSUs 20, the rate of load acceptance of the PSUs 50 can be controlled and the BMs 22 will react to the resulting increase in voltage between the DC bus bars 14, 16 by a corresponding controlled decrease in the amount of current output from the BMs 22 to the DC bus bars 14, 16. The target output voltage 110 can be used in the power system 10 to (a) ensure that the ATSPSUs 20 are sharing in supplying DC output power to the DC bus bars 14, 16 equally, (b) control whether the ATSPSUs 20 or the BMs 22 are outputting DC power to the DC bus bars 14, 16, (c) control rate of increase of output of the PSUs 50 during transition from the BMs 22 providing DC power to the DC bus bars 14, 16 to the ATSPSU's 20 resuming providing DC power to the DC bus bars 14, 15, and (d) limit the maximum current output of the PSUs 50 in the event of a short circuit.

In embodiments of the power system 10, one or more of the ATSPSUs 20 can be turned off to maximize efficiency of the combination of the other ATSPSUs 20. For example, the ATSPSUs 20 can configured to communicate their efficiency vs power level curve at initial startup and then their output power level (e.g., repeatedly at a suitable interval, for example, at a rate of 100 [Hz]) to the BPA controller 62 and/or the management module 102, which can decide if some of the ATSPSUs 20 should be turned off in order to achieve maximum efficiency of the remaining ATSPSUs 20.

Figure 10:
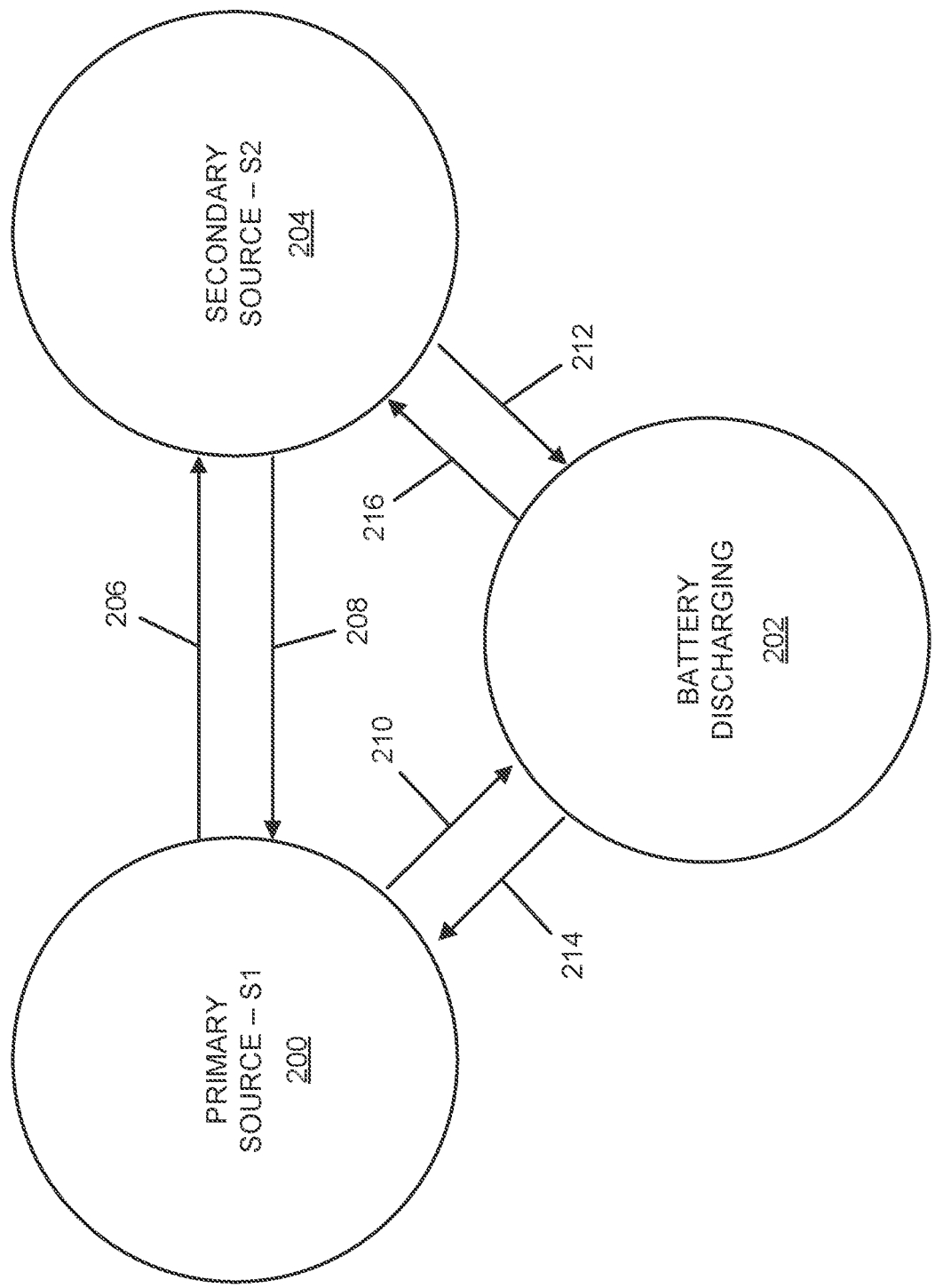
FIG. 10 is a simplified schematic diagram illustrating operational modes of the power system of FIG. 1, in accordance with some embodiments.

FIG. 10 is a simplified schematic diagram illustrating operational modes 200, 202, 204 of the power system of 10, in accordance with some embodiments. In the following description, the operational modes 200, 202, 204 are described with reference to all of the ATSPSUs 20 and all of the BMs 22 operating in accordance with the respective operational mode. It should be understood, however, any suitable combinations of the operational modes can be employed in a power system 10 that includes multiple ATSPSUs 20 and multiple BMs 22. In operational mode 200, the ATSPSUs 20 are supplying DC power to the DC bus bars 14, 16 via power supplied by the primary AC power source and the BMs 22 do not supply DC power to the DC bus bars 14, 16 and can be recharged during operational mode 200. In operational mode 202, the BMs 22 are supplying DC power to the DC bus bars 14, 16 and the ATSPSUs 20 do not supply DC power to the DC bus bars 14, 16. In operational mode 204, the ATSPSUs 20 are supplying DC power to the DC bus bars 14, 16 via power supplied by the secondary AC power source and the BMs 22 do not supply DC power to the DC bus bars 14, 16. In operation mode 204, recharging of the BMs 22 can be limited and/or prevented to prevent overloading the secondary AC power source. For example, when operational mode 204 is used in the datacenter power management system 100, the total load applied to the secondary AC power source by the data center server rack components can be compared relative to a maximum acceptable total load serviceable by the secondary AC power source to determine if any spare capacity exists for charging of the BMs 22 and recharging of the BMs 22 can be controlled to avoid overloading the secondary AC power source.

In embodiments, transition from one of the operational modes 200, 202, 204 to another of the operational modes 200, 202, 204 can be accomplished in response to the occurrence of any suitable condition(s), such as those described herein. For example, transition from operational mode 200 (power supplied via the primary AC power source) to operational mode 204 (power supplied via the secondary AC power source) can be accomplished in response to the occurrence of condition 206. In condition 206, the voltage of the primary AC power source drops by a sufficient amount over a corresponding sufficient amount of time and the state of charge of the BMs 22 is below a useful value. Upon occurrence of condition 206, the ATSPSUs 20 perform an immediate switch over to operation using AC power supplied by the secondary AC power source from AC power supplied by the primary AC power source.

Transition from operational mode 204 to operational mode 200 can be accomplished in response to the occurrence of condition 208. In condition 208, the voltage of the secondary AC power source drops by a sufficient amount over a corresponding sufficient amount of time and the state of charge of the BMs 22 is below a useful value. Upon occurrence of condition 208, the ATSPSUs 20 perform an immediate switch over to operation using AC power supplied by the primary AC power source from using AC power supplied by the secondary AC power source.

Figure 11:
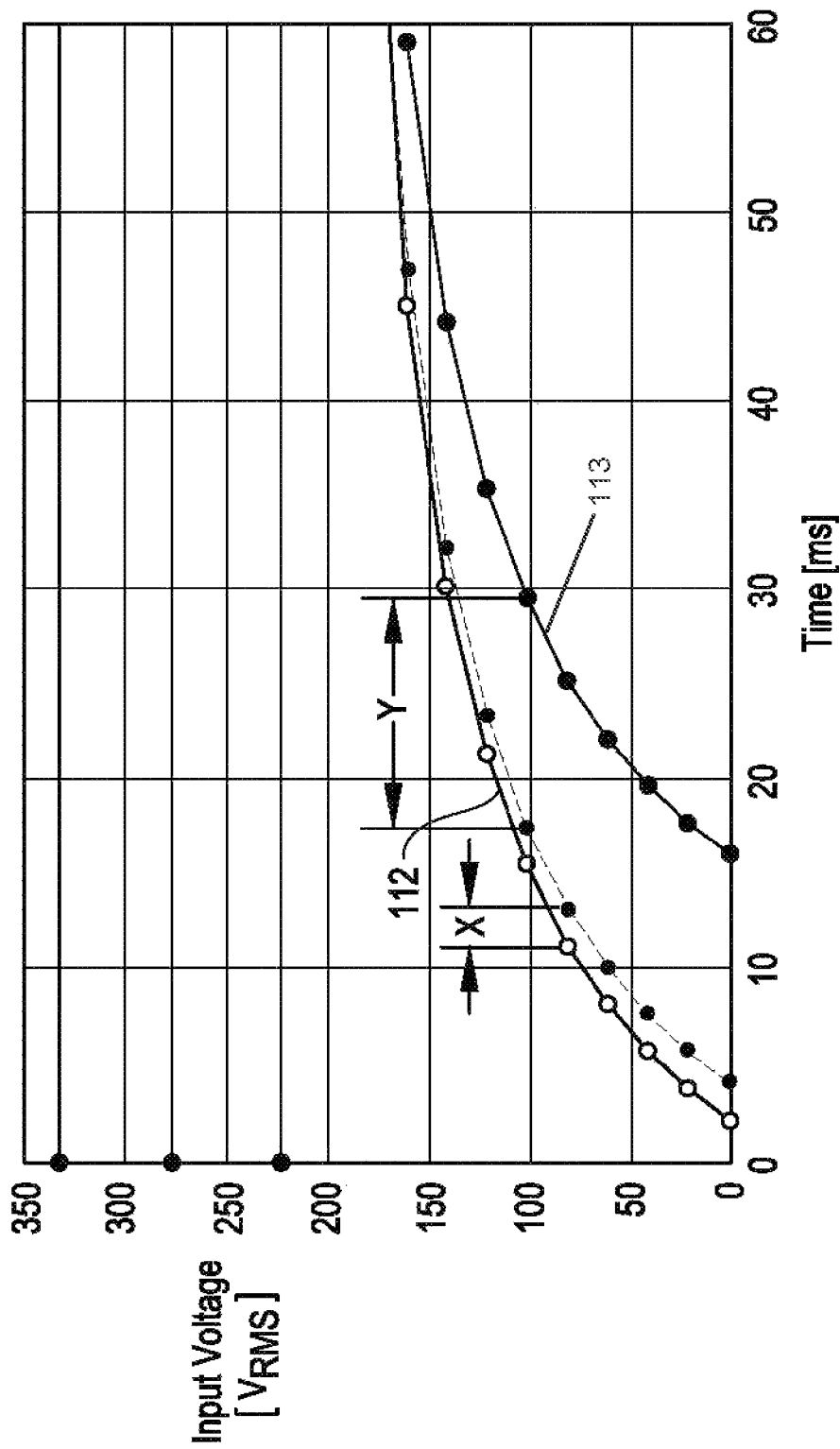
FIG. 11 shows a curve defining when the voltage of a primary power source has decreased in magnitude long enough to warrant transition to battery power in embodiments of the power system of FIG. 1.

FIG. 11 shows a curve 112 defining when the voltage of an AC power source has decreased in magnitude long enough to warrant suspension supply of DC power generated by the ATSPSUs 20 via AC power supplied by the primary AC power source to the DC bus bars 14, 16. As shown, the greater the voltage drop the shorter the allowable period of time that can occur and still ignore the voltage drop instance. By using curve 112, insignificant voltage drop instances (e.g., short time period and/or short voltage drop level) can be ignored with respect to deciding whether to switch from the current operational mode of the power system 10. In many embodiments, the curve 112 can be selected relative to a curve 113 representing a voltage drop versus time that would result in the PSU 50 failing to generate a sufficient voltage level for DC power output by the PSU 50 to the DC bus bars 14, 16. For example, the curve 112 can be selected relative to the curve 113 so that a switching time (X) for the ATSPSU 20 to switch from operating via AC power from the primary AC power source to the secondary AC power source is sufficiently small to ensure continued ability of the PSU 50 to deliver DC power at a sufficient voltage level to the DC bus bars 14, 16, or to control the PSU 50 to discontinue supplying DC power to the DC bus bars 14, 16 prior to being incapable of delivering DC power at a sufficient voltage level to the DC bus bars 14, 16.

FIG. 12 shows a table 114 of programmable configurations of the ATSPSUs 20, in accordance with some embodiments. Switching to the secondary AC power source can be problematic if too much load is transferred to the secondary AC power source so as to overload the secondary AC power source, thereby bringing all the systems down connected to the secondary AC power source. The ability to configure the ATSPSUs 20 to have different priority levels enables reconfiguration of the server racks 12 to behave differently in the event of a disruption of the primary AC power source, and can be used to help avoid overloading the secondary AC power source.

Transition from operational mode 200 to operational mode 202 can be accomplished in response to the occurrence of condition 210. In condition 210, the voltage of the primary AC power source drops by a sufficient amount over a corresponding sufficient amount of time and the state of charge of the BMs 22 is above a useful value. Upon occurrence of condition 210, the PSUs 50 are isolated from the DC bus bars 14, 16, thereby causing an associated drop in the voltage between the DC bus bars 14, 16. The BMs 22 react to the voltage drop between the DC bus bars 14, 16 and ramp up output of DC power to the DC bus bars 14, 16 in response. The ATSs 48 do not transfer from the primary AC power source to the secondary AC power source.

Transition from operational mode 204 to operational mode 202 can be accomplished in response to the occurrence of condition 212. In condition 212, the voltage of the secondary AC power source drops by a sufficient amount over a corresponding sufficient amount of time and the state of charge of the BMs 22 is above a useful value. Upon occurrence of condition 212, the PSUs 50 are isolated from the DC bus bars 14, 16, thereby causing an associated drop in the voltage between the DC bus bars 14, 16. The BMs 22 react to the voltage drop between the DC bus bars 14, 16 and ramp up output of DC power to the DC bus bars 14, 16 in response. The ATSs 48 do not transfer from the secondary AC power source to the primary AC power source.

Figure 13:
FIG. 13 shows a table of return to source times as a function of remaining battery powered operational time for embodiments of the ATSPSU of the power system of FIG. 1.

Transition from operational mode 202 to operational mode 200 can be accomplished in response to the occurrence of condition 214. In condition 214, the primary AC power source has demonstrated acceptable voltage over a sufficient period of time to be considered sufficiently reliable. In embodiments, the state of charge of the BMs 22 is considered in deciding how fast to revert to operational condition 200. FIG. 13 shows a table 116 of example return to source times as a function of remaining battery powered operational time that can be used to determine how fast to revert to operational condition 200. Once the transition to operation mode 200 initiates, the PSUs 50 can be controlled to ramp up DC output at a rate suitable for the primary AC power source.

Transition from operational mode 202 to operational mode 204 can be accomplished in response to the occurrence of condition 216. In condition 214, the secondary AC power source has demonstrated acceptable voltage over a sufficient period of time to be considered sufficiently reliable. In embodiments, the state of charge of the BMs 22 is considered in deciding how fast to revert to operational condition 204. Table 116 of FIG. 13 shows example return to source times as a function of remaining battery powered operational time that can be used to determine how fast to revert to operational condition 204. Once the transition to operation mode 204 initiates, the PSUs 50 can be controlled to ramp up DC output at a rate suitable for the secondary AC power source.

Figure 14:
FIG. 14 shows a table of time to wait before charging as a function of remaining battery powered operational time for embodiments of the ATSPSU of the power system of FIG. 1.

Following transition from operational mode 202 to operational mode 200, charging of the BMs 22 can be controlled based on the state of charge of the BMs 22. For example, FIG. 14 shows a table 118 of time to wait before charging as a function of remaining battery powered operational time. The rate at which the BMs 22 are recharged can be limited to a suitable rate, such as the power rating assigned to the power system 10 minus the amount of power being supplied to the server rack 12 by the power system 10. The ramp rate of the power used to recharge the BMs 22 can be controlled in accordance with the maximum ramp rate of the primary AC power source. Following transition from operational mode 202 to operational mode 204, charging of the BMs 22 can be inhibited to avoid potential overloading of the secondary AC power source.

In embodiments, the PSU 50 is disabled in response to voltage droop instances via stop switching in the PSU 50. Because disabling the PSU 50 stops current flowing through the ATS 48, the design of the ATS 48 can be simplified because the ATS 48 can safely transfer between sources without the need for complex protection devices.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A power system for supplying direct current (DC) power to a server rack, the power system comprising:
   a backplane assembly (BPA) configured to be mounted in the server rack and including:
   a BPA DC output electrically connected with DC bus bars of the server rack;
   a BPA first alternating current (AC) input;
   a BPA second AC input;
   BPA automatic transfer switch power supply unit (ATSPSU) connector assemblies, each of the BPA ATSPSU connector assemblies including a BPA first AC output connector electrically coupled with the BPA first AC input, a BPA second AC output connector electrically coupled with the BPA second AC input, and a BPA DC input connector electrically connected with the BPA DC output; and
   BPA battery module (BM) connector assemblies, each of the BPA BM connector assemblies including a BM DC connector electrically coupled with the BPA DC output;
   detachably mountable automatic transfer switch power supply units (ATSPSUs), each of the ATSPSUs including:
   a power supply unit (PSU) configured to output DC power;
   an automatic transfer switch (ATS) configured to supply electric power to the PSU and automatically switch between a first AC power source and a second AC power source;
   an ATSPSU controller configured to control operation of the ATS or the PSU; and
   an ATSPSU connector assembly configured to electrically connect with one of the BPA ATSPSU connector assemblies, the ATSPSU connector assembly being configured to electrically couple the ATS with each of the BPA first and second AC output connectors and electrically couple the PSU with the BPA DC input connector; and
   detachably mountable battery modules, each of the battery modules including:
   a battery cell;

a battery module (BM) connector assembly detachably and electrically connected with one of the BPA BM connector assemblies; and a BM controller configured to control DC current flow between the battery cell and the BM connector assembly.

2. The power system of claim 1, wherein:

the server rack has a front side;

each of the ATSPSUs are insertable into the server rack through the front side so as to interface the respective ATSPSU connector assembly with a respective one of the BPA ATSPSU connector assemblies; and each of the battery modules is insertable into the server rack through the front side so as to interface the respective BM connector assembly with a respective one of the BPA BM connector assemblies.

3. The power system of claim 1, wherein at least one BM controller is configured to:

monitor a voltage difference between the DC bus bars of the server rack; and transfer DC power to the DC bus bars in response to the voltage difference between the DC bus bars being less than a threshold value.

4. The power system of claim 1, wherein:

the BPA includes a communication bus;

each of the BPA ATSPSU connector assemblies includes a BPA ATSPSU communication connector communicatively coupled with the communication bus;

each ATSPSU connector assembly includes an ATSPSU communication connector communicatively coupled with the ATSPSU controller;

each of the BPA BM connector assemblies includes a BPA BM communication connector communicatively coupled with the communication bus;

each BM connector assembly includes a BM communication connector communicatively coupled with the BM controller; and at least one BM controller is configured to transmit a signal via the communication bus indicative of a state of charge of the battery cell.

5. The power system of claim 4, wherein at least one BM controller is configured to:

receive a charging command via the communication bus and initiate charging of the battery cell in response to receiving the charging command; or receive a no charging command via the communication bus and prevent charging of the battery cell in response to receiving the no charging command.

6. The power system of claim 4, wherein:

the BPA includes an external communication port communicatively coupled with the communication bus; and at least one ATSPSU controller is configured to receive an ATSPSU operational command via the external communication port and to control operation of the ATS or the PSU in accordance with the ATSPSU operational command, at least one BM controller is configured to receive a BM operational command via the external communication port and to control DC current flow between the battery cell and the BM connector assembly in accordance with the BM operational command, or at least one BM controller is configured to transmit a signal via the external communication port indicative of the state of charge of the battery cell.

7. The power system of claim 4, wherein:

the BPA includes a system controller communicatively coupled with the communication bus; and at least one ATSPSU controller is configured to receive an ATSPSU operational command from the system controller and control operation of the ATS or the PSU in accordance with the ATSPSU operational command, at least one BM controller is configured to receive a BM operational command from the system controller and control DC current flow between the battery cell and the BM connector assembly in accordance with the BM operational command, and at least one BM controller is configured to transmit a signal to the system controller via the communication bus indicative of the state of charge of the battery cell.

8. A power system, comprising:

a backplane assembly (BPA) configured to be mounted in a server rack and electrically coupled with direct current (DC) bus bars of the server rack, a first AC power source, and a second AC power source;

an automatic transfer switch power supply unit (ATSPSU) configured to be electrically coupled with the DC bus bars, the first AC power source, and the second AC power source via the BPA; the ATSPSU including:

a power supply unit (PSU) configured to output DC power;

an automatic transfer switch (ATS) configured to supply electric power to the PSU and automatically switch between receiving AC power from a first AC power source and receiving AC power from a second AC power source; and an ATSPSU controller configured to control operation of the ATS or the PSU;

a battery module configured to be electrically coupled with the DC bus bars via the BPA and including:

a battery cell; and a battery module (BM) controller configured to control DC current flow from the battery cell and the bus bars.

9. The power system of claim 8, wherein:

the server rack has a front side;

the ATSPSU is insertable into the server rack through the front side so as to interface with the BPA and demountable from the BPA via removal of the ATSPSU from the server rack via the front side; and the battery module is insertable into the server rack through the front side so as to interface with the BPA and demountable from the BPA via removal of the battery module from the server rack via the front side.

10. The power system of claim 8, wherein the BM controller is configured to:

monitor a voltage difference between the DC bus bars of the server rack; and transfer DC power to the DC bus bars in response to the voltage difference between the DC bus bars being less than a threshold value.

11. The power system of claim 8, wherein:

the BPA includes a communication bus; and the BM controllers is configured to transmit a signal via the communication bus indicative of a state of charge of the battery cell.

12. The power system of claim 11, wherein the BM controller is configured to:

receive a charging command via the communication bus and initiate charging of the battery cell in response to receiving the charging command; or receive a no charging command via the communication bus and prevent charging of the battery cell in response to receiving the no charging command.

13. The power system of claim 11, wherein:
the BPA includes an external communication port communicatively coupled with the communication bus; and
at least one of the ATSPSU controllers is configured to receive an ATSPSU operational command via the external communication port and control operation of the ATS or the PSU in accordance with the ATSPSU operational command,
at least one of the BM controllers is configured to receive a BM operational command via the external communication port and control DC current flow between the battery cell and the bus bars in accordance with the BM operational command, or
at least one of the BM controller is configured to transmit a signal via the external communication port indicative of the state of charge of the battery cell.

14. The power system of claim 11, wherein:
the BPA includes a system controller communicatively coupled with the communication bus; and
at least one of:
at least one of the ATSPSU controllers is configured to receive an ATSPSU operational command from the system controller and control operation of at least one of the ATS and the PSU in accordance with the ATSPSU operational command;
at least one of the BM controllers is configured to receive a BM operational command from the system controller and control DC current flow between the one or more battery cells and the bus bars in accordance with the BM operational command; and
at least one of the BM controllers is configured to transmit a signal to the system controller via the communication bus indicative of the state of charge of the respective one or more battery cells.

15. A method, comprising:
receiving an alternating current (AC) power input from a first AC power source;
transferring a first portion of the AC power input to a first automatic transfer switch (ATS);
generating a first DC power input from the first portion of the AC power input via a first power supply unit (PSU);
transferring the first DC power input to DC bus bars of a server rack;
transferring a second portion of the AC power input to a second ATS;
generating a second DC power input from the second portion of the AC power input via a second power supply unit (PSU); and
transferring the second DC power input to the DC bus bars of the server rack.

16. The method of claim 15, further comprising:
monitoring, by a battery module controller, a voltage difference between the DC bus bars of the server rack; and
in response to detecting, by the battery module controller, that the voltage difference between the DC bus bars is less than a threshold value, controlling, by the battery module controller, transfer of DC power from a battery module to the DC bus bars.

17. The method of claim 16, further comprising:
receiving, by the battery module controller, a charging command; and
charging, under control of the battery module controller, the battery module in response to receiving the charging command.

18. The method of claim 16, further comprising:
receiving, by the battery module controller, a no charging command; and
preventing, by the battery module controller, charging of the battery module in response to receiving the no charging command.

19. The method of claim 16, further comprising:
monitoring a voltage differential between the bus bars of the server rack;
monitoring a voltage of the first AC power source;
monitoring a voltage of a second AC power source;
switching from receiving AC power from the first AC power source to receiving AC power from the second AC power source, the switching being performed in response to:
the voltage of the second AC power source being above a second AC power source valid threshold voltage;
the voltage of the first AC power source having dropped over a period of time more than an allowable amount; and
the voltage differential between the bus bars being less than a battery low threshold value.

20. The method of claim 19, further comprising:
monitoring a state of charge of the battery module via communication of the state of charge from the battery module controller;
monitoring a voltage of the first AC power source;
monitoring a voltage of the second AC power source;
switching from receiving AC power from the first AC power source to receiving AC power from the second AC power source, the switching being performed in response to:
the voltage of the second AC power source being above a second AC power source valid threshold voltage;
the voltage of the first AC power source having dropped over a period of time more than an allowable amount; and
the state of charge of the battery module being less than a threshold state of charge.

* * * * *